United States Patent
Nidhi et al.

(10) Patent No.: US 9,947,585 B2
(45) Date of Patent: Apr. 17, 2018

(54) MULTI-GATE TRANSISTOR WITH VARIABLY SIZED FIN

(71) Applicant: Intel Corporation, Santa Clara, CA (US)

(72) Inventors: Nidhi Nidhi, Hillsboro, OR (US); Chia-Hong Jan, Portland, OR (US); Roman W. Olac-Vaw, Hillsboro, OR (US); Hsu-Yu Chang, Hillsboro, OR (US); Neville L. Dias, Hillsboro, OR (US); Walid M. Hafez, Portland, OR (US); Rahul Ramaswamy, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/127,839

(22) PCT Filed: Jun. 27, 2014

(86) PCT No.: PCT/US2014/044517
§ 371 (c)(1),
(2) Date: Sep. 21, 2016

(87) PCT Pub. No.: WO2015/199712
PCT Pub. Date: Dec. 30, 2015

(65) Prior Publication Data
US 2017/0103923 A1  Apr. 13, 2017

(51) Int. Cl.
*H01L 29/78* (2006.01)
*H01L 29/76* (2006.01)
(Continued)

(52) U.S. Cl.
CPC .......... *H01L 21/823412* (2013.01); *H01L 21/26586* (2013.01); *H01L 21/823418* (2013.01);
(Continued)

(58) Field of Classification Search
CPC ........... H01L 29/7851; H01L 29/1073; H01L 29/42368; H01L 29/0847;
(Continued)

(56) References Cited

U.S. PATENT DOCUMENTS

| | | | |
|---|---|---|---|
| 7,214,991 B2* | 5/2007 | Yeo | H01L 21/823828 257/331 |
| 7,332,386 B2* | 2/2008 | Lee | H01L 21/845 257/E21.221 |

(Continued)

FOREIGN PATENT DOCUMENTS

| | | |
|---|---|---|
| CN | 103779217 A | 5/2014 |
| JP | 2003298063 A | 10/2003 |
| JP | 2006294995 A | 10/2006 |

OTHER PUBLICATIONS

International Searching Authority, "Notification of Transmittal of the International Search Report of the International Searching Authority," dated Mar. 26, 2015, in International application No. PCT/US2014/044517.
(Continued)

*Primary Examiner* — Dao H Nguyen
(74) *Attorney, Agent, or Firm* — Trop, Pruner & Hu, P.C.

(57) ABSTRACT

An embodiment includes an apparatus comprising: a non-planar transistor comprising a fin, the fin including a source region having a source region width and a source region height, a channel region having a channel region width and a channel region height, a drain region having a drain width and a drain height, and a gate dielectric formed on a sidewall (Continued)

of the channel region; wherein the apparatus includes at least one of (a) the channel region width being wider than the source region width, and (b) the gate dielectric including a first gate dielectric thickness at a first location and a second gate dielectric thickness at a second location, the first and second locations located at an equivalent height on the sidewall and the first and second gate dielectrics thicknesses being unequal to one another. Other embodiments are described herein.

24 Claims, 6 Drawing Sheets

(51) Int. Cl.
    *H01L 27/088*     (2006.01)
    *H01L 21/283*     (2006.01)
    *H01L 21/8234*     (2006.01)
    *H01L 21/265*     (2006.01)
    *H01L 29/08*     (2006.01)
    *H01L 29/10*     (2006.01)
    *H01L 29/423*     (2006.01)

(52) U.S. Cl.
    CPC .. *H01L 21/823431* (2013.01); *H01L 27/0886* (2013.01); *H01L 29/0847* (2013.01); *H01L 29/1037* (2013.01); *H01L 29/42368* (2013.01); *H01L 29/7851* (2013.01)

(58) Field of Classification Search
    CPC ..... H01L 21/823412; H01L 21/823418; H01L 21/823431; H01L 27/0886
    USPC ........ 257/392, 401, 329, 331, 369, E29.136, 257/E29.137, E29.262, E29.279, E21.221, 257/E21.336, E21.442, E21.635, E21.638, 257/E27.062, E27.112; 438/197, 199, 438/212, 585
See application file for complete search history.

(56) References Cited

U.S. PATENT DOCUMENTS

| | | | |
|---|---|---|---|
| 8,716,786 B2* | 5/2014 | Baumgartner | H01L 29/66818 257/331 |
| 2004/0110331 A1* | 6/2004 | Yeo | H01L 21/823828 438/199 |
| 2005/0269629 A1 | 12/2005 | Lee et al. | |
| 2006/0180840 A1 | 8/2006 | Nishimuta et al. | |
| 2006/0273415 A1 | 12/2006 | Kim | |
| 2008/0303095 A1 | 12/2008 | Xiong et al. | |
| 2010/0187575 A1 | 7/2010 | Baumgartner et al. | |
| 2012/0146157 A1* | 6/2012 | Baumgartner | H01L 29/66818 257/401 |
| 2013/0075811 A1* | 3/2013 | Wang | H01L 29/66795 257/329 |
| 2014/0183629 A1* | 7/2014 | Meiser | H01L 29/785 257/337 |
| 2015/0001641 A1* | 1/2015 | Yoo | H01L 29/42368 257/402 |

OTHER PUBLICATIONS

European Patent Office, Supplementary Partial European Search Report dated Jan. 10, 2018 in European patent application No. 14896232.7.

* cited by examiner

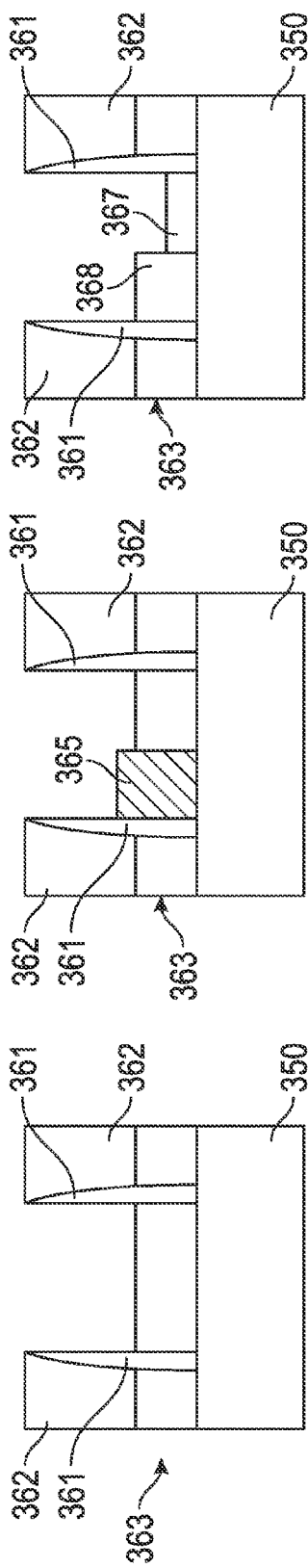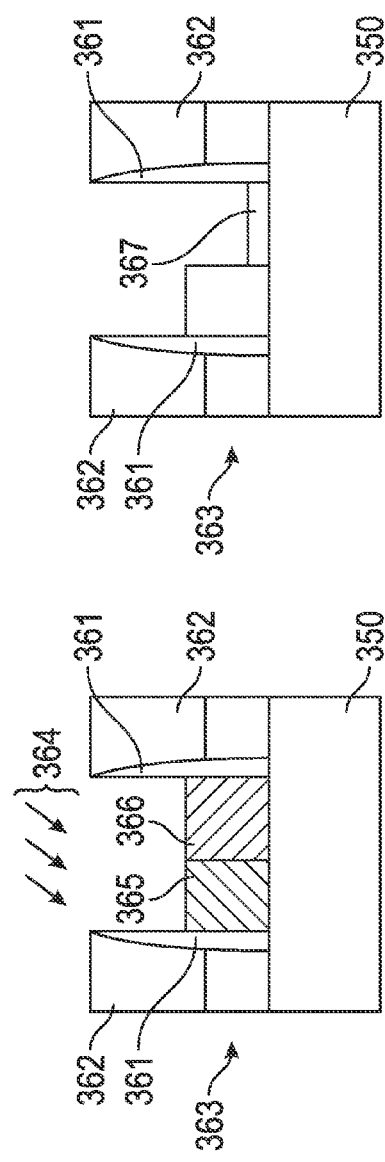

MULTI-GATE TRANSISTOR WITH VARIABLY SIZED FIN

TECHNICAL FIELD

Embodiments of the invention are in the field of semiconductor devices and, in particular, non-planar transistors.

BACKGROUND

A FinFET is a transistor built around a thin strip of semiconductor material (referred to as the "fin"). The transistor includes the standard field effect transistor (FET) nodes/components: a gate, a gate dielectric, a source region, and a drain region. The conductive channel of the device resides on the outer sides of the fin beneath the gate dielectric. Specifically, current runs along both "sidewalls" of the fin as well as along the top side of the fin. Because the conductive channel essentially resides along the three different outer, planar regions of the fin, such a FinFET is typically referred to as a "tri-gate" FinFET. Other types of FinFETs exist (such as "double-gate" FinFETs in which the conductive channel principally resides only along both sidewalls of the fin and not along the top side of the fin).

BRIEF DESCRIPTION OF THE DRAWINGS

Features and advantages of embodiments of the present invention will become apparent from the appended claims, the following detailed description of one or more example embodiments, and the corresponding figures, in which:

FIGS. 3(a)-(e) illustrate a process to produce a differential fin transistor using patterned etching of a fin in an embodiment of the invention.

DETAILED DESCRIPTION

Figure 1A:
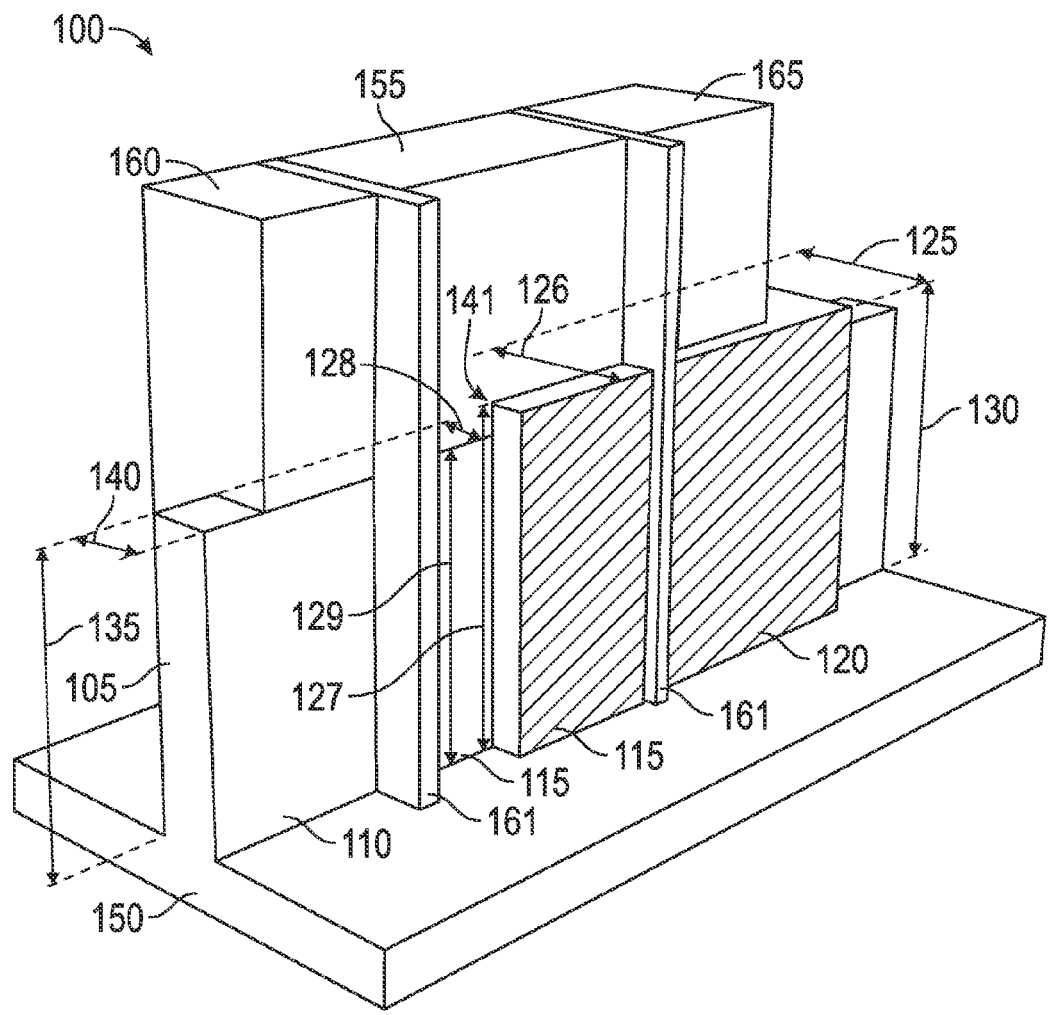
FIG. 1(a) includes a perspective view of an embodiment of a differential fin transistor.

Reference will now be made to the drawings wherein like structures may be provided with like suffix reference designations. In order to show the structures of various embodiments more clearly, the drawings included herein are diagrammatic representations of semiconductor/circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings. For example, not every layer of a semiconductor device is necessarily shown. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact.

Some system on a chip (SoC) process technologies use FinFET architecture with aggressively scaled gate length (Lg) to provide performance and area scaling. One adverse effect of this lateral scaling (i.e., shortening of Lg) is that the support for low current leakage and high voltage devices, both of which are included in SoCs and are therefore important for successful SoC processes, becomes difficult due to the divergent transistor architecture of these low leakage/high voltage transistors compared to the minimum design rule (i.e., nominally sized) low voltage transistor (e.g., logic transistor). Put another way, while the tri-gate architecture has provided significant improvement in sub-threshold characteristics and short channel effects in low voltage, high speed, logic devices, that improvement in short channel effects has not improved the performance of high voltage devices due to large gate overdrive at the operating voltages. Also, while further scaling of fin dimensions is important for maintaining subthreshold characteristics as the gate lengths Lg are aggressively scaled, these scaled fin dimensions show degraded channel resistance and adversely impact the high voltage performance. It has also been observed that the performance degradation under high voltage stress conditions increases rapidly with fin scaling.

In short, SoC architectures demand a large leakage and performance range and a wide range of operating voltages to accommodate both low voltage and high voltage devices within a single SoC. The low voltage, high speed logic devices on the SoC require scaling of fin dimensions (e.g., thinner fin width and shorter fin height) to improve short channel effects for scaled gate length transistors. However, the high voltage transistors on the same SoC suffer degradation in high voltage performance with fin scaling (e.g., thinner fin width) since the impact of improved threshold voltage is minimal at high gate overdrive.

Embodiments discussed herein address the issue of accommodating both low voltage switching devices (e.g., low voltage logic transistors) and high voltage switching devices (e.g., input/output (I/O) transistors) in a single SoC.

One embodiment includes a device structure with differential fin width and height (i.e., varying fin width and fin height), which takes advantage of the scaled fin dimensions to support exceptional subthreshold characteristics for the device and, at the same time, has better reliability and lower gate-induced drain leakage (GIDL) which are both desirable characteristics for a high voltage device. The process flow for creating the device structure is compatible with conventional tri-gate formation processes. Specifically, one embodiment has a narrow fin width at the source side of the channel (to improve short channel effects) and a wider fin width on the drain side of the same channel (to reduce gate field in the drain region thereby reducing GIDL, improving hot carrier effects under stress conditions, and improving device breakdown due to lower vertical electric field). Such embodiments are sometimes referred to herein as "differential fin" devices because within such devices one portion of the fin differs in width from another portion of that same fin. This difference in fin width may occur within the channel of the device where the channel includes a fin portion that has a width transition. As described immediately above, the wider portion may be closer to the drain.

Another embodiment includes a controlled method of achieving differential fin dimension (i.e., a fin with differing widths) on a SoC. This method may produce an embodiment where the circuit of a SoC includes transistors that have different width fins (and consequently, different width channels). For example, an embodiment includes a first transistor that has a channel that is a wider than a channel of a second transistor, whereby both of the first and second transistors are in a circuit of the SoC. This is sometimes referred to herein as a "dual fin" structure because the first and second transistors have differing fin widths ("dual fins") that form the channels having differing widths.

Such embodiments (e.g., dual fin and differential fin devices) offer numerous advantages over conventional devices, at least some of which are now addressed. First, a wider fin width can significantly improve the performance of a high voltage device. For example, narrowing a fin by 1 nm can degrade drive current within that fin by 10% at matched leakage. This is caused due to degraded channel resistance for narrower fins. Thus, thickened fin portions in differential and dual fin structure embodiments attain significant performance gain versus conventional high voltage device architectures. Second, high Vcc devices usually suffer from impact ionization due to hot carriers, which causes performance degradation (e.g., drive degradation) over a period of time. This issue increases with narrower fin width. Since, the impact ionization predominantly occurs in the drain side of the channel, the wider fin width in the differential fin process (with a wider fin in the channel and/or drain) provides improvement in reliability for matched performance. Third, the differential fin and dual fin processes (described in greater detail below) are integrated/compatible with conventional CMOS manufacturing processes. Such integration occurs without impacting the performance and subthreshold characteristics of low voltage, high speed logic devices (thereby enabling a high speed, low leakage process). Fourth, forming differential fins using patterned semiconductor growth/deposition processes (addressed below) provides the flexibility to use different semiconductor materials within the transistor channel. For example, a transistor may include a widened channel region because the fin is formed from the same material as the substrate (e.g., Si) but is then thickened (for example, in the channel region) due to epitaxially growing a second material (e.g., a IV or III-V material) on the fin. Fifth, patterned semiconductor growth can be replaced by gate dielectric deposition to provide a way to achieve different gate dielectric thickness within the same channel. In other words, the channel may have a portion adjacent the source with a gate dielectric that is thinner than a portion of gate dielectric that is adjacent the drain. This thicker dielectric provides better breakdown and reliability characteristics while having a thinner dielectric adjacent the source provides better short channel effects.

A more detailed discussion of various embodiments now follows.

Figure 1B:
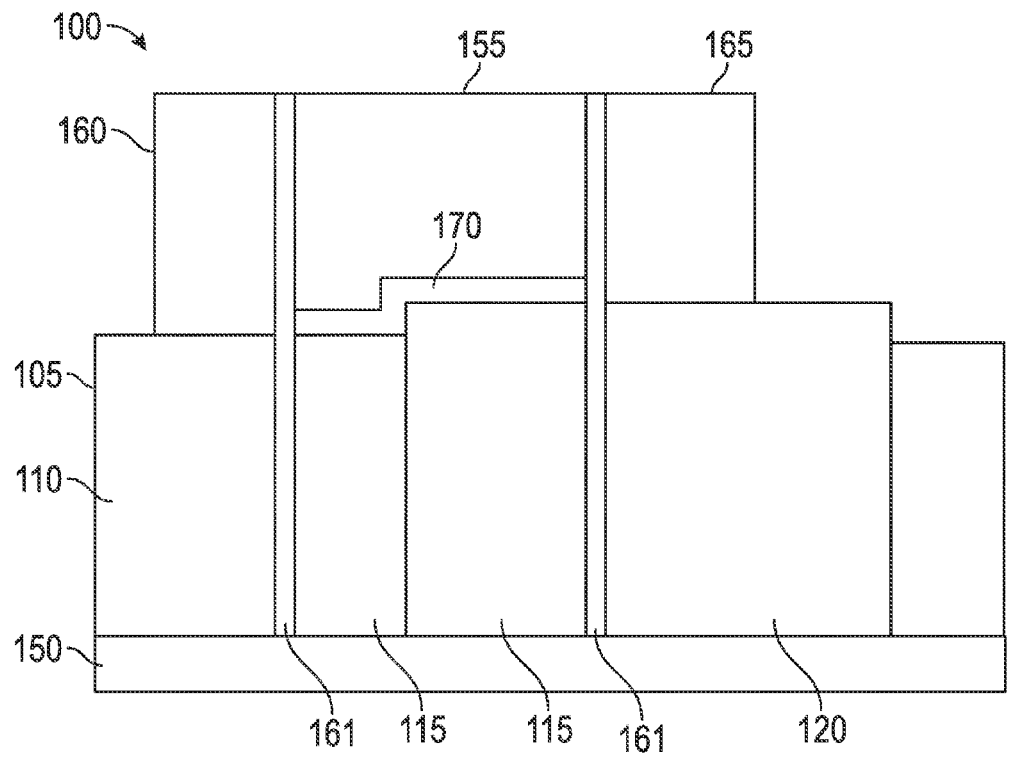
FIG. 1(b) includes a side view of the embodiment of FIG. 1(a).

FIG. 1(a) includes a perspective view of an embodiment of a differential fin transistor 100. FIG. 1(b) includes a side view of the embodiment of FIG. 1(a). The non-planar transistor comprises a fin 105, the fin including a source region 110 having a source region width 140 and a source region height 135, a channel region 115 having a channel region width 126 and a channel region height 127, a drain region 120 having a drain width 125 and a drain height 130, and a gate dielectric 170 formed on a sidewall of the channel region 115. Spacer dielectric 161 separates contacts 155, 160, 165. Gate dielectric 170 is shown in FIG. 1(b) but not in FIG. 1(a) for purposes of clarity. The channel region width 126 is wider than the source region width 140. The channel region height 127 is taller than the source region height 135. For example, in an embodiment height 135 is between 40-150 nm (e.g., 50, 70, 90, 110, 130 nm), height 127 is additional 1-10 nm (e.g., 3, 6, 9 nm) above that of height 135, width 140 is between 4-15 nm (e.g., 6, 8, 10, 12, 14 nm), and width 126 is an additional 0.5-2 nm (e.g., 0.7, 0.9, 1.1, 1.3, 1.5, 1.7, 1.9 nm) beyond that of width 140.

As shown in FIG. 1(a), the drain region width 125 is wider than the source region width 140 and the drain region height 130 is taller than the source region height 135 because the drain region width 125 is the same as the channel region width 126 and the drain region height 130 is the same as the channel region height 127. However, in other embodiments this may not be the case and the drain region width 125 may be wider than the source region width 140 but different (i.e., thicker or thinner) from the channel region width 126. In other embodiments the drain region height 130 may be taller than the source region height 135 but different (i.e., shorter or taller) from the channel region height 127.

An embodiment has an additional channel region width 128 and an additional channel region height 129 and the channel region width 126 is wider than the additional channel region width 128. Further, channel region height 127 is higher than the additional channel region height 129. In other words, in the embodiment of FIG. 1(a) there is a width and height differential or transition within the channel (see location 141), but in other embodiments the entire channel is primarily of uniform width and height (and that uniform width and height may be wider and taller than either or both of the source width 140 and drain width 125 and/or source height 135 and drain height 130). In the embodiment of FIG. 1(a) the thinner channel region is located between a wider channel region and the source region. Where the transition 141 occurs within the channel may vary among differing embodiments. For example, in some embodiments the transition occurs midway along the channel, closer to the source, or closer to the drain.

In some embodiments there may be more than one transition. For example, FIG. 1(a) shows a single fin transition at location 141 but other embodiments may include two or more transitions. For example, an embodiment includes a thin channel portion adjacent the source, a thicker channel portion equidistant from the source and drain, and a thicker channel portion adjacent the drain. The transition may be sharp such that the thicker portion of the channel includes a face generally orthogonal to a sidewall of the thinner portion of the channel. However, in other embodiments there may be a graded transition that more slowly increases the thickness of the channel towards the drain and away from the source.

In an embodiment the channel region includes first and second materials and the widened channel region width is located at a portion of the channel region where the second material is formed on the first material. For example, in FIG. 1(a) near the source the channel region includes the fin at the same thinness as the fin that includes the source. The fin may include, for example, silicon (Si). The thicker portion of the channel adjacent the drain includes an epitaxial (EPI) material formed over the original fin to thereby increase the thickness of the channel portion near the drain. The epitaxial layer may include, for example, a IV or III-V material like SiGe. In such an embodiment there may be barrier layers and the like between the fin and the EPI layer. However, in other embodiments the entire channel portion may be monolithic and include, for example, Si. However, in such an embodiment the thinner portion may have been etched to achieve the thinness. In another embodiment, the thicker portion of the channel region may include the same material as the original fin, only a layer of the material (e.g., Si) may be formed on the fin.

Figure 1C:
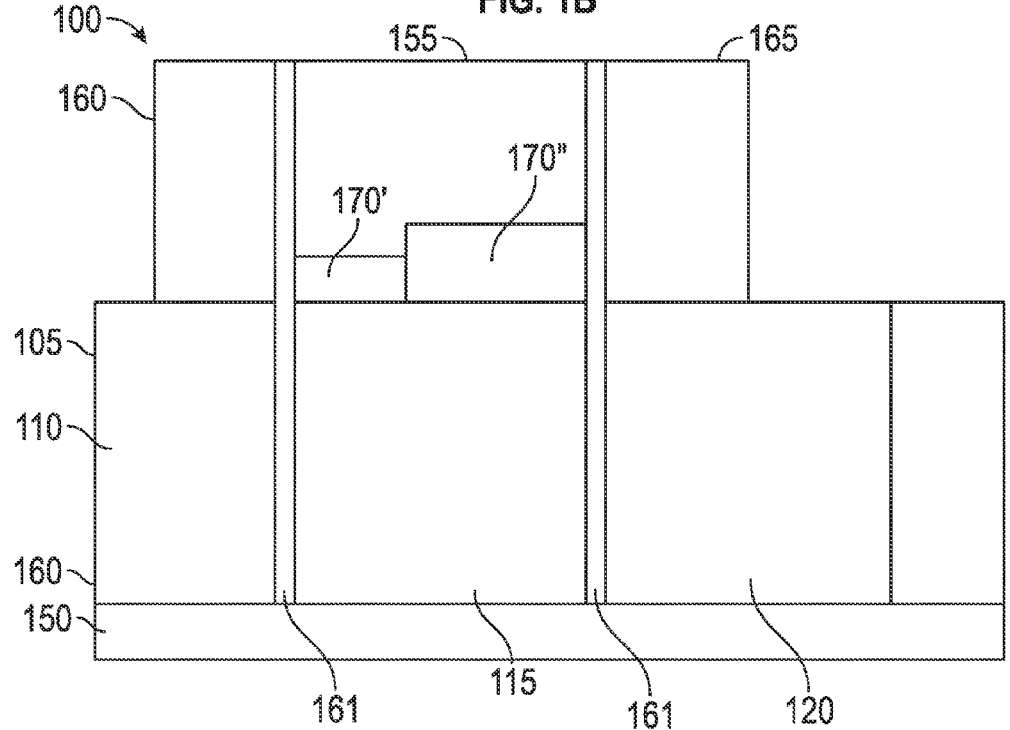
FIG. 1(c) includes a different embodiment that includes a differential gate oxide.

FIG. 1(c) includes another embodiment of the invention. FIG. 1(c) depicts an apparatus that includes gate dielectric including a first dielectric portion 170' having first gate dielectric height and a second dielectric portion 170" having a second gate dielectric height that is greater than the first height. While not shown in the side view of FIG. 1(c), the dielectric portion 170" may also be thicker than dielectric portion 170' at equivalent heights up on the sidewall of the fin portion that includes the channel. Thus, the embodiment of FIG. 1(c) may include a channel that has a consistent fin height and width (i.e., not a differential fin within the channel region) but that has a differential gate dielectric. In other words, the channel may have a portion adjacent the source with a gate dielectric that is thinner than a portion of gate dielectric that is adjacent the drain. This thicker dielectric provides better breakdown and reliability characteristics while having a thinner dielectric adjacent the source provides better short channel effects.

Other embodiments may include both a differential fin in the channel region as well as a differential gate dielectric for the channel region.

An embodiment includes a device having a differential fin in the channel region on a SoC that comprises at least two logic transistors. Thus, an embodiment includes a single SoC that accommodates both low voltage logic devices and high voltage devices such as the differential fin transistor of FIG. 1(a). In an embodiment the at least two logic transistors are collinear with the non-planar transistor. Thus, the embodiment allows a single original fin that is then processed to form the two logic transistors as well as the differential fin transistor. The three transistors are collinear in that a single long axis intersects the source, drain, and channel for each transistor. In an embodiment the non-planar transistor of FIG. 1(a) is coupled to a first voltage source and one of the at least two logic transistors is coupled to a second voltage source having a lower maximum operating voltage than the first voltage source. In an embodiment device coupled to the first voltage source is coupled to an input/output (I/O) node. Such a device is not a logic device.

Figure 2A:
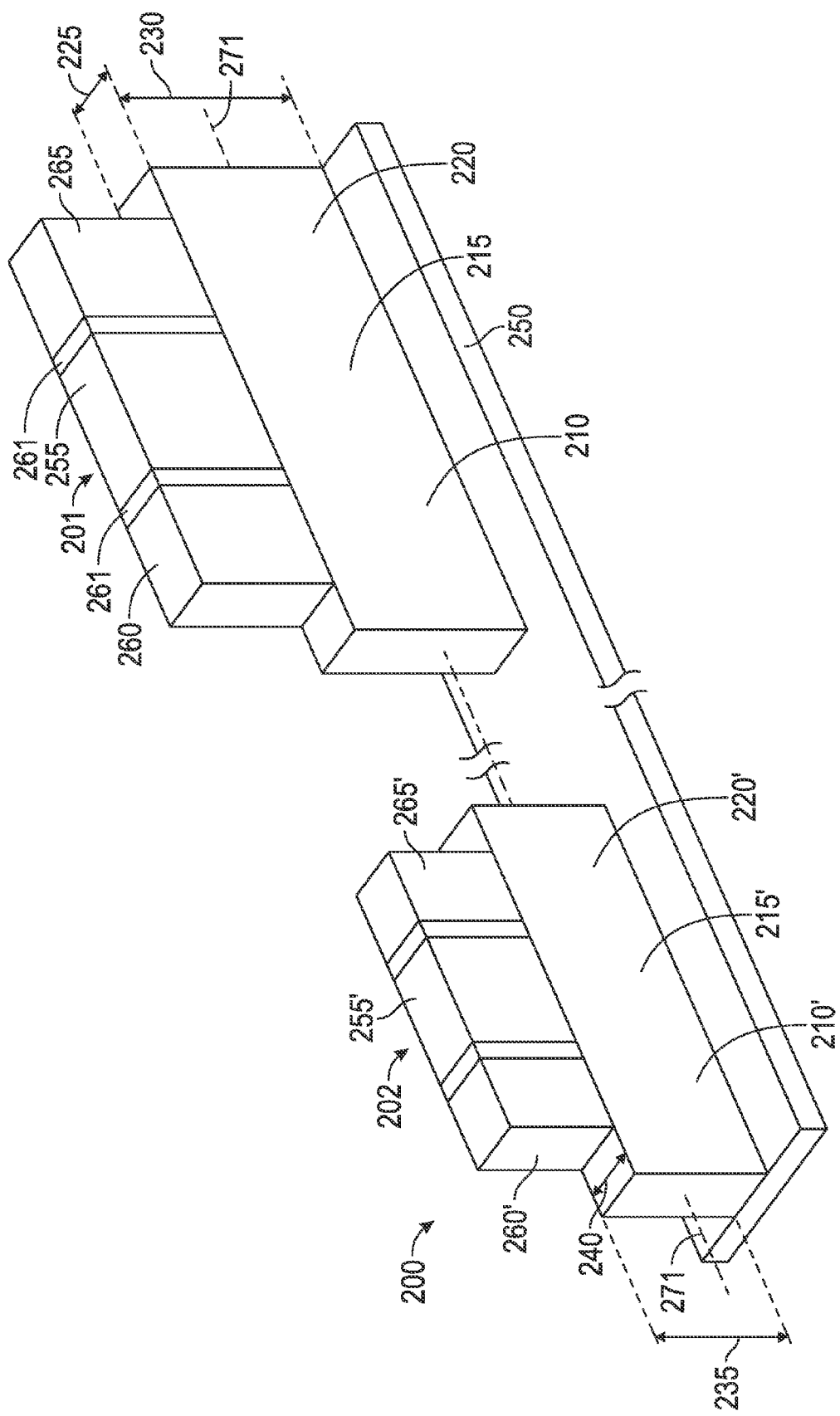
FIG. 2(a) includes a perspective view of an embodiment of a dual fin transistor.

FIG. 2(a) includes a perspective view of an embodiment of a dual fin transistor. SoC 200 comprises a first non-planar transistor 201 comprising a first fin, the first fin including a first source region 210 having a first source region width 225 and a first source region height 230, a first channel region 215 having a first channel region width 225 and a first channel region height 230, a first drain region 220 having a first drain width 225 and a first drain height 230, and a first gate dielectric (not shown) formed on a sidewall of the first channel region. A second non-planar transistor 202 comprises a second fin, the second fin including a second source region 210' having a second source region width 240 and a second source region height 235, a second channel region 215' having a second channel region width 240 and a second channel region height 235, a second drain region 220' having a second drain width 240 and a second drain height 235, and a second gate dielectric (not shown) formed on a sidewall of the second channel region 215'. In an embodiment, the first channel region width 225 is wider than the second channel region width 240 and/or the first channel region height 230 is taller than the second channel region height 235. Thus, FIG. 2(a) discloses a dual fin architecture or configuration.

SoC 200 includes the first fin having a long axis 271 intersecting the first source region 210, first channel region 215, and first drain region 220, and the second fin including the same axis 271 intersecting the second source region 210' second channel region 215', and second drain region 220'. Thus, the fin portions of devices 201 and 202 are collinear with one another. This reflects how in an embodiment the devices 201, 202 (and the fin portions upon which they are formed) are derived from a common monolithic fin.

In the embodiment of FIG. 2(a) the first source region width 225, the first channel region width 225, and the first drain width 225 are all generally equal to one another. However, in another embodiment (not shown) the first channel region 215 has a channel region width greater than the width of the first source region 210. In an embodiment the channel region itself may have a differential fin such that the channel region 215 has varying widths (e.g., channel region 215 is thicker near drain 220 and thinner near source 210).

Figure 2B:
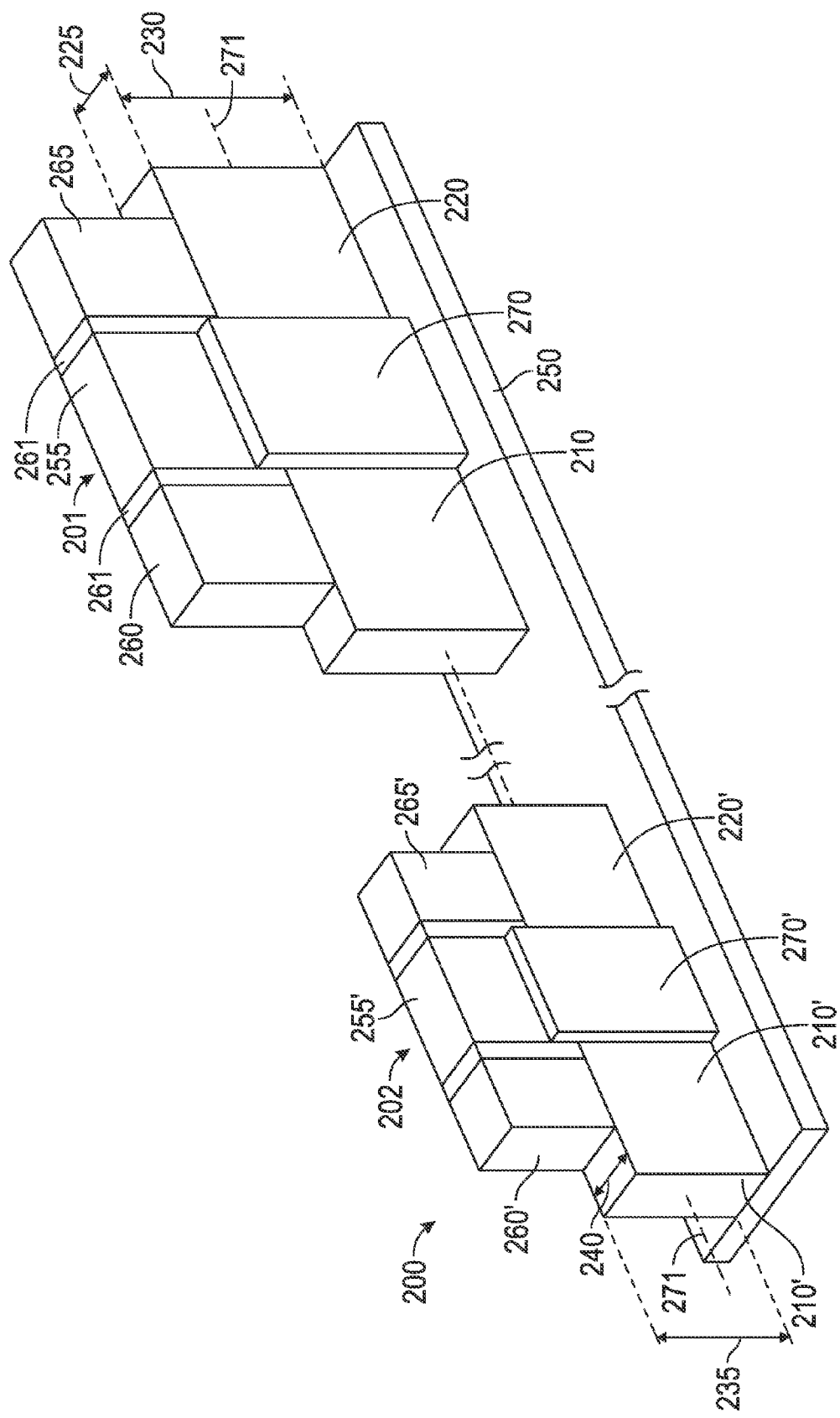
FIG. 2(b) includes a perspective view of another embodiment of a dual fin transistor.

FIG. 2(b) includes a perspective view of an embodiment of a dual fin transistor. This is very similar to FIG. 2(a) but includes a fin in device 201 that is the same thickness as the fin of device 202. In other words, in FIG. 2(b) width 225 is equal to width 240 and height 230 is equal to height 235. However, gate oxide 270 is thicker than gate oxide 270' and/or taller than gate oxide 270'.

There are many ways of implementing a differential fin or dual fin process. For example, FIGS. 3(a)-(e) illustrate a process to produce a differential fin transistor using patterned etching of a fin. As yet another example, FIGS. 4(a)-(e) illustrate a process to produce a dual fin transistor using a deposition technique. Other possible techniques are possible.

Regarding FIGS. 3(a)-(e), these figures show a differential fin patterning technique using the bottom antireflective coating (BARC) process. The differential fin is created using a patterned etch inside the gate area of the transistor.

Specifically, FIG. 3(a) depicts a stage in transistor processing wherein a "dummy gate" has been removed leaving a void between spacers 361 and above fin 363. Fin 363 is located above substrate 350 and below Inter-Layer Dielectric (ILD) 362. FIG. 3(b) depicts a BARC layer spun onto fin 363. An angled ion implant 364 is then performed to harden portion 365 of the BARC layer but not portion 366 of the BARC layer. Only a portion of the BARC layer is hardened due to the angled nature of the ion implanting and the shielding provided by ILD 362 and one of the spacers 361. FIG. 3(c) depicts a point in the process wherein the unhardened BARC has been removed leaving only BARC portion 365. FIG. 3(d) then allows for the fin 363 to be etched at area 367 such that some (e.g., 50%) of the channel/gate area is etched and the remaining portion of the channel/gate area is not etched. FIG. 3(e) illustrates the removal of BARC portion 365 yielding a channel region 367 that is etched and another channel region 368 that is not etched. Thus, portion 367 is thinner and/or shorter than portion 368 yielding a differential fin transistor that may then be subjected to further processing (e.g., conventional CMOS processing).

FIGS. 4(a)-(e) provide a process flow overview for fabricating a differential fin transistor by epitaxial deposition of wider fin material. This allows flexibility for using different semiconductors in the source/drain region and even deposition of dielectric instead of semiconductor leading to differential gate dielectric in the same gate.

Figure 4A:
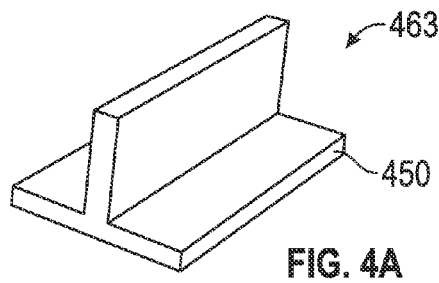
FIGS. 4(a)-(e) illustrate a process to produce a dual fin transistor using a deposition technique in an embodiment of the invention.
Figure 4B:
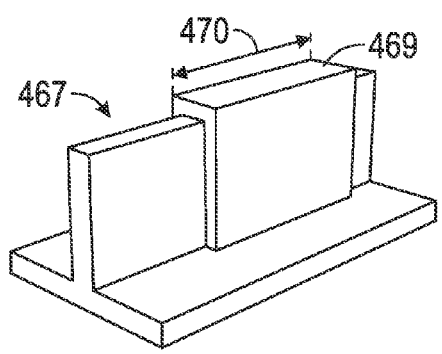

Specifically, in FIG. 4(a) a fin 463 is provided on a substrate 450. In FIG. 4(b) a material (which may or may be the same material as included in fin 463) is formed on fin 463. This material 469 may be formed epitaxially. The material may include a class IV or III-V material or other material. The length 470 may be determined based on design goals. For example, length 470 may be used as just a portion of what will become a differential fin transistor wherein the wider and/or taller material portion 469 is used to comprise a subportion of a channel. Length 470 may be used to comprise some or all of what will become a differential fin transistor wherein the wider and/or taller material portion 469 is used to comprise some or all of a channel (regardless of whether the source and/or drain also include any of portion 469). Another design goal may be to form a dual fin system. In such a case, length 470 may be made long enough to form a source, channel, and drain for a high or higher voltage device (e.g., transistor included in an I/O or clock portion of a circuit) and portion 467 may be used to form a thin fin conventional low or lower voltage device (e.g., logic transistor). While not shown, FIG. 4(b) should not be interpreted to necessarily indicate portion 467 is immediately adjacent material 469. For example, in a dual fin architecture portion 467 may be, relatively, a long distance from material 469 while still originating from the same fin at an earlier point in the process.

Figure 4C:
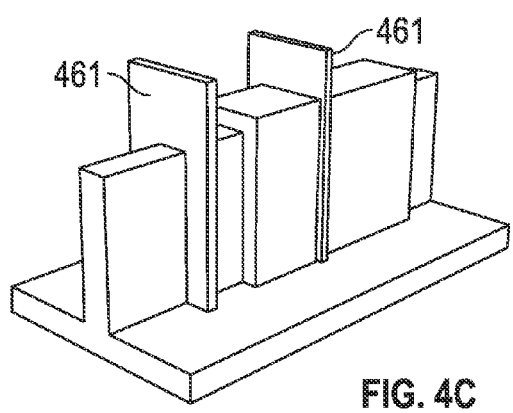
Figure 4D:
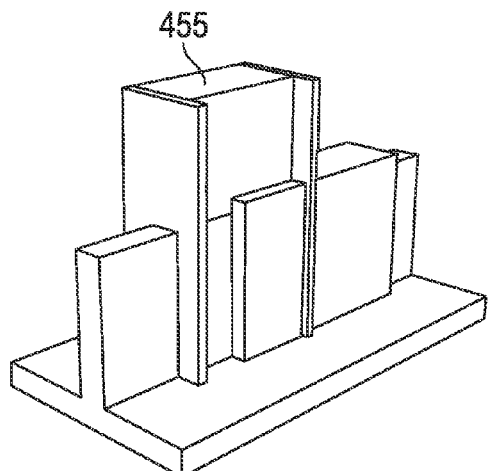
Figure 4E:
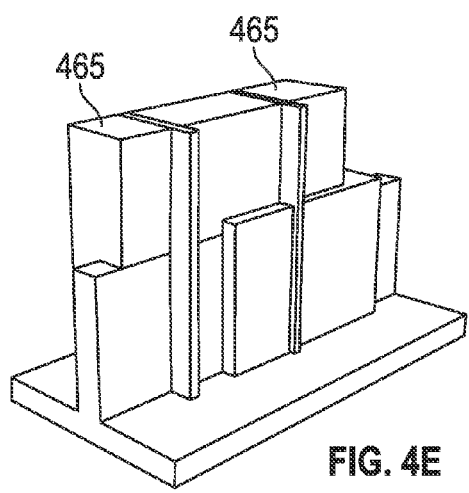

In FIG. 4(c) spacers 461 are applied. In the case presented in FIG. 4(c), the spacers are arranged to form a differential fin transistor such as the embodiment shown in FIG. 1(a). In FIG. 4(d) a gate contact 455 is formed and in FIG. 4(e) source contact 460 and drain contact 465 are formed.

As described above using several non-exhaustive examples, there are various ways of achieving a differential fin within a transistor. First, a process may include etching a semiconductor fin to create a thin fin region with a thinner/thicker fin transition that forms a differential fin. Second, a process may include the deposit of a semiconductor in a thick fin region to create a differential fin. This allows for using different semiconductors in the source/drain region (e.g., a Si based source, drain, and channel with a SiGe EPI layer on some or all of the channel portion of the fin). Third, a process may include the deposition of dielectric to form a thick dielectric region to achieve a differential gate dielectric (whereby the fin may be consistent width but some of the gate dielectric is thicker near one of the source/drain nodes and thinner near another of the source/drain nodes. Fourth, a patterned oxidation of a fin (e.g., Si fin) in the gate may consume some of the fin to create a thinner fin portion. This oxide can be later removed to produce a differential fin.

Various embodiments include a semiconductive substrate. Such a substrate may be a bulk semiconductive material this is part of a wafer. In an embodiment, the semiconductive substrate is a bulk semiconductive material as part of a chip that has been singulated from a wafer. In an embodiment, the semiconductive substrate is a semiconductive material that is formed above an insulator such as a semiconductor on insulator (SOI) substrate. In an embodiment, the semiconductive substrate is a prominent structure such as a fin that extends above a bulk semiconductive material.

The following examples pertain to further embodiments.

Example 1 includes An apparatus comprising: a non-planar transistor comprising a fin, the fin including a source region having a source region width and a source region height, a channel region having a channel region width and a channel region height, a drain region having a drain width and a drain height, and a gate dielectric formed on a sidewall of the channel region; wherein the apparatus includes at least one of (a) the channel region width being wider than the source region width, and (b) the gate dielectric including a first gate dielectric thickness at a first location and a second gate dielectric thickness at a second location, the first and second locations located at an equivalent height on the sidewall and the first and second gate dielectrics thicknesses being unequal to one another.

In example 2 the subject matter of the Example 1 can optionally include wherein the apparatus includes the channel region width being wider than the source region width.

In example 3 the subject matter of the Examples 1-2 can optionally include wherein the channel region height is taller than the source region height.

In example 4 the subject matter of the Examples 1-3 can optionally include wherein the drain region width is wider than the source region width and the drain region height is taller than the source region height.

In example 5 the subject matter of the Examples 1-4 can optionally include wherein the channel region has an additional channel region width and an additional channel region height and the channel region width is wider than the additional channel region width.

In example 6 the subject matter of the Examples 1-5 can optionally include wherein the channel region height is higher than the additional channel region height.

In example 7 the subject matter of the Examples 1-6 can optionally include wherein the channel region width is located at a first location and the additional channel region width is located at a second location positioned between the first location and the source region.

In example 8 the subject matter of the Examples 1-7 can optionally include wherein the channel region includes first and second materials and the channel region width is located at a portion of the channel region where the second material is formed on the first material.

In example 9 the subject matter of the Examples 1-8 can optionally include comprising a substrate including the first material, wherein the second material is epitaxially formed on the first material.

In example 10 the subject matter of the Examples 1-9 can optionally include wherein the additional channel region width is located at an additional portion of the channel region that does not include the second material.

In example 11 the subject matter of the Examples 1-10 can optionally include wherein the apparatus includes the gate dielectric including a first gate dielectric thickness at a first location and a second gate dielectric thickness at a second location, the first and second locations being a same height up on the sidewall and the first and second gate dielectrics thicknesses being unequal to one another.

In example 12 the subject matter of the Examples 1-11 can optionally be included in a system-on-chip (SoC) that comprises at least two logic transistors.

In example 13 the subject matter of the Examples 1-12 can optionally include wherein the at least two logic transistors are collinear with the non-planar transistor.

In example 14 the subject matter of the Examples 1-13 can optionally include wherein the non-planar transistor is coupled to a first voltage source and one of the at least two logic transistors is coupled to a second voltage source having a lower maximum operating voltage than the first voltage source.

In example 15 the subject matter of the Examples 1-14 can optionally include wherein the non-planar transistor is coupled to an input/output (I/O) node.

Example 16 includes A system on a chip (SoC) comprising: a first non-planar transistor comprising a first fin, the first fin including a first source region having a first source region width and a first source region height, a first channel region having a first channel region width and a first channel region height, a first drain region having a first drain width and a first drain height, and a first gate dielectric formed on a sidewall of the first channel region; and a second non-planar transistor comprising a second fin, the second fin including a second source region having a second source region width and a second source region height, a second channel region having a second channel region width and a second channel region height, a second drain region having a second drain width and a second drain height, and a second gate dielectric formed on a sidewall of the second channel region; wherein the SoC comprises at least one of (a) the first channel region width being wider than the second channel region width, and (b) the first gate dielectric being thicker than the second gate dielectric.

In example 17 the subject matter of the Example 16 can optionally include wherein the SoC comprises the first channel region width being wider than the second channel region width and the first channel region height being higher than the second channel region height.

In example 18 the subject matter of the Examples 16-17 can optionally include wherein (a) the first fin includes a first long axis intersecting the first source region, first channel region, and first drain region, (b) the second fin includes a second long axis intersecting the second source region, second channel region, and second drain region, and (c) the first long axis is collinear with the second long axis.

In example 19 the subject matter of the Examples 16-18 can optionally include wherein the first and second fins are derived from a common monolithic fin.

In example 20 the subject matter of the Examples 16-19 can optionally include wherein the first source region width, the first channel region width, and the first drain width are all generally equal to one another.

In example 21 the subject matter of the Examples 16-20 can optionally include wherein the first channel region has an additional first channel region width and the first channel region width is wider than the additional first channel region width.

Example 22 includes a method comprising: forming a fin on a substrate, the fin having first, second, and third regions and the second region having a first location adjacent the first region and a second location adjacent the third region; performing an action selected from the group comprising: (a) removing a portion of the second region at the first location, and (b) forming a material on the fin at the second location; and forming a source region in the first region, a channel region in the second region, and a drain region in the third region; wherein the channel region has a first channel region width at the first location and a second channel width at a second location on the fin, the second channel width being wider than the first channel width.

In example 23 the subject matter of the Example 22 can optionally include removing the portion of the second region at the first location.

In example 24 the subject matter of the Examples 21-23 can optionally include comprising forming a material on the fin at the second location.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. An apparatus comprising:
   a non-planar transistor comprising a fin, the fin including a source region having a source region width and a source region height, a channel region having a channel region width and a channel region height, a drain region having a drain region width and a drain region height, and a gate dielectric formed on a sidewall of the channel region;
   wherein (a) the channel region width is wider than the source region width, and (b) the channel region height is taller than the source region height.

2. The structure of claim 1, wherein the drain region width is wider than the source region width and the drain region height is taller than the source region height.

3. The structure of claim 1, wherein the channel region has an additional channel region width and an additional channel region height and the channel region width is wider than the additional channel region width.

4. The structure of claim 3, wherein the channel region height is higher than the additional channel region height.

5. The structure of claim 3, wherein the channel region width is located at a first location and the additional channel region width is located at a second location positioned between the first location and the source region.

6. The structure of claim 3, wherein the channel region includes first and second materials and the channel region width is located at a portion of the channel region where the second material is formed on the first material.

7. The structure of claim 6 comprising a substrate including the first material, wherein the second material is epitaxially formed on the first material.

8. The structure of claim 6, wherein the additional channel region width is located at an additional portion of the channel region that does not include the second material.

9. The structure of claim 1 included in a system-on-chip (SoC) that comprises at least two logic transistors.

10. The structure of claim 9, wherein the at least two logic transistors are collinear with the non-planar transistor.

11. The structure of claim 9, wherein the non-planar transistor is coupled to a first voltage source and one of the at least two logic transistors is coupled to a second voltage source having a lower maximum operating voltage than the first voltage source.

12. The structure of claim 9, wherein the non-planar transistor is coupled to an input/output (I/O) node.

13. An apparatus comprising:
a non-planar transistor comprising a fin, the fin including a source region having a source region width and a source region height, a channel region having a channel region width and a channel region height, a drain region having a drain region width and a drain region height, and a gate dielectric formed on a sidewall of the channel region;
wherein (a) the channel region width is wider than the source region width, (b) the channel region has an additional channel region width that is narrower than the channel region width, and (c) the channel region includes first and second materials, which are different from one another, and the channel region width is located at a portion of the channel region where the second material is formed on the first material.

14. The structure of claim 13 wherein the channel region height is taller than the source region height.

15. The structure of claim 13 wherein the drain region width is wider than the source region width and the drain region height is taller than the source region height.

16. The structure of claim 13 wherein the channel region has an additional channel region height that is shorter than the channel region height.

17. The structure of claim 13 wherein the channel region width is located at a first location and the additional channel region width is located at a second location positioned between the first location and the source region.

18. The structure of claim 13 comprising a substrate including the first material, wherein the second material is epitaxially formed on the first material.

19. The structure of claim 13, wherein the additional channel region width is located at an additional portion of the channel region that does not include the second material.

20. The structure of claim 13 included in a system-on-chip (SoC) that comprises at least two logic transistors, wherein the non-planar transistor is coupled to a first voltage source and one of the at least two logic transistors is coupled to a second voltage source having a lower maximum operating voltage than the first voltage source.

21. The structure of claim 13 included in a system-on-chip (SoC) that comprises at least two logic transistors, wherein the non-planar transistor is coupled to an input/output (I/O) node.

22. An apparatus comprising:
a non-planar transistor comprising a fin, the fin including a source region having a source region width and a source region height, a channel region having a channel region width and a channel region height, a drain region having a drain region width and a drain region height, and a gate dielectric formed on a sidewall of the channel region;
wherein (a) the channel region has an additional channel region width and an additional channel region height, and (b) the channel region height is higher than the additional channel region height.

23. The structure of claim 22 wherein the channel region height is higher than the source region height.

24. The structure of claim 23 wherein the channel region width is wider than the source region width.

* * * * *